(12) United States Patent
Song

(10) Patent No.: US 10,964,868 B2
(45) Date of Patent: Mar. 30, 2021

(54) LED DISPLAY MODULE

(71) Applicant: TETOS Co., Ltd., Asan-si (KR)

(72) Inventor: Kun Ho Song, Asan-si (KR)

(73) Assignee: TETOS Co., Ltd., Asan-si (KR)

( * ) Notice: Subject to any disclaimer, the term of this patent is extended or adjusted under 35 U.S.C. 154(b) by 58 days.

(21) Appl. No.: 16/548,849

(22) Filed: Aug. 23, 2019

(65) Prior Publication Data

US 2020/0303608 A1  Sep. 24, 2020

(30) Foreign Application Priority Data

Mar. 20, 2019 (KR) .................. 10-2019-0031575

(51) Int. Cl.
*H01L 33/62* (2010.01)
*H01L 33/20* (2010.01)
*H01L 33/38* (2010.01)

(52) U.S. Cl.
CPC .............. *H01L 33/62* (2013.01); *H01L 33/20* (2013.01); *H01L 33/38* (2013.01)

(58) Field of Classification Search
CPC ..... H01L 27/153; H01L 27/156; H01L 33/62; H01L 33/20; H01L 33/38; H01L 25/167; H01L 25/0753

See application file for complete search history.

(56) References Cited

U.S. PATENT DOCUMENTS

2018/0190631 A1* 7/2018 Kim .................. H01L 27/156

* cited by examiner

*Primary Examiner* — Sue A Purvis
*Assistant Examiner* — Scott Stowe
(74) *Attorney, Agent, or Firm* — Revolution IP, PLLC

(57) ABSTRACT

The disclosure relates to an LED display module, and more particularly to an LED display module, in which a conductive metal thin film layer formed by deposition is used to configure lateral side wiring for connecting an upper circuit pattern and a lower circuit pattern of a substrate, thereby removing a bezel, and guaranteeing display quality because a division line or a bezel line is not seen even when a plurality of modules undergoes tiling to get a desired display size.

3 Claims, 4 Drawing Sheets

- Conventional Art -

LED DISPLAY MODULE

CROSS-REFERENCE TO RELATED APPLICATION

This application claims priority from Korean Patent Application No. 10-2019-0031575, filed on Mar. 20, 2019 in the Korean Intellectual Property Office, the disclosure of which is incorporated herein by reference.

BACKGROUND OF THE INVENTION

(a) Field of the Invention

The disclosure relates to a light emitting diode (LED) display module, and more particularly to an LED display module, in which a conductive metal thin film layer formed by deposition is used to configure lateral side wiring for connecting an upper circuit pattern and a lower circuit pattern of a substrate, thereby removing a bezel, and guaranteeing display quality because a division line or a bezel line is not seen even when a plurality of modules undergoes tiling to get a desired display size.

(b) Description of the Related Art

A micro light emitting diode (LED) refers to a subminiature LED, of which a structure is similar to that of a conventional LED but a chip has a microscopic size of 10~100 µm, and is usable for a pixel of a display product. As compared with the conventional LED, the micro LED has high contrast, is advantageous in light of a response speed and a viewing angle, and is excellent in brightness and limiting resolution. Further, as compared with an organic light emitting diode (OLED), the micro LED is superior in terms of chemical and mechanical stability, has a long lifespan, and consumes less power.

A conventional LED display has a structure based on a mini LED (with LED devices at intervals of 0.3 mm~5 mm Pitch X-Y Matrix) or a micro LED (with LED devices at intervals of 50~300 µm). In general, the conventional LED display has a structure as shown in FIG. 1.

Referring to FIG. 1, the conventional LED display generally includes a substrate 30, a plurality of display devices (LEDs) 50 arrayed on the substrate 30, upper and lower circuit patterns 60 and 80 for the plurality of LEDs 50, a controller device 70 for controlling signals for the plurality of display devices, etc. and the controller device 70 receives power through power supplying wiring 85.

In FIG. 1, (a) shows a structure that an area of a bezel B is provided to mount the controller device 70 onto a top side of the substrate 30, and a flexible printed circuit board (FPCB) is formed as the power supplying wiring 85 to supply power and/or a signal to the controller device 70 mounted throughout the bottom and top sides of the substrate 30.

Further, (b) in FIG. 1 shows a structure that the controller device 70 is mounted to the bottom side of the substrate 30 without the area of the bezel B, the display device 50 and the controller device 70 are connected by the lower circuit pattern 80 through a via hole formed in the substrate 30, and the power supplying wiring 85 is used to supply power and/or a signal to the controller device 70 mounted to the bottom side of the substrate 30.

In addition, (c) in FIG. 1 shows a structure that the controller device 70 is mounted to the bottom side of the substrate 30, the area of the bezel B is provided to connect the upper circuit pattern 60 and the controller device 70 by a lateral side wiring 90 corresponding to the FPCB, and the power supplying wiring 85 is used to supply power and/or a signal to the controller device 70 mounted to the bottom side of the substrate 30.

The LED display shown in (b) of FIG. 1 has short comings: mechanical strength is so low that a substrate is likely to break when the substrate is made of glass, and there is a need of forming the via holes and thus relatively much time, effort and cost are required in manufacture.

Further, the LED displays shown in (a) and (c) of FIG. 1 have shortcomings that the bezel B is formed and thus a bezel line is seen on a screen. In particular, even though the lateral side wiring 90 is applied as shown in (c) of FIG. 1, there are shortcomings that a screen division line (i.e. the bezel) is seen because the conventional FPCB has been used for the lateral side wiring 90 to supply the signal and power.

Accordingly, to make an LED display screen effective in terms of power consumption, screen brightness, contrast, etc., the screen with the mini LEDs or the micro LEDs needs to be configured without the bezel B. Ultimately, a circuit configuration has to employ a lateral side portion of the substrate. However, there has not hitherto been proposed an LED display structure in which the screen is configured without the bezel and the wiring for supplying the power and/or the signal is formed on the lateral side portion of the substrate.

SUMMARY OF THE INVENTION

Accordingly, the disclosure is conceived to solve the foregoing problems, and an aspect of the disclosure is to provide a light emitting diode (LED) display module, in which a conductive metal thin film layer formed by deposition is used to configure lateral side wiring for connecting an upper circuit pattern and a lower circuit pattern of a substrate, thereby removing a bezel, and guaranteeing display quality because a division line or a bezel line is not seen even when a plurality of modules is subjected to tiling to get a desired display size.

Another aspect of the disclosure is to provide an LED display module, in which a plurality of display devices is divided into at least two classification groups, and lateral side wiring portion includes at least two conductive metal thin film layers stacked respectively corresponding to the at least two classification groups, thereby having an effect on coping with large increase in narrow and long wiring caused as micro LEDs are used to make a large-format high-resolution display.

In accordance with an embodiment of the present disclosure, there is provided an LED display module including: a substrate; a plurality of display devices mounted to a top side of the substrate; an upper circuit pattern formed on the top side of the substrate; a controller device mounted to the top side or a bottom side of the substrate; a lower circuit pattern formed on the bottom side of the substrate; and lateral side wiring electrically connecting the upper circuit pattern and the lower circuit pattern, the display device including a micro LED, the lateral side wiring including a conductive metal thin film layer formed by deposition, and the LED display module further including a protection layer deposited on the lateral side wiring.

Further, the LED display modules may be arrayed as connected in at least one of horizontal direction and a vertical direction to configure an LED display, the protection layers of the connected LED display modules adjacent to each other may be in surface contact with each other, and the protection layer may include a rounded edge portion.

Further, the plurality of display devices may be divided into at least two classification groups, and the lateral side wiring may include at least two conductive metal thin film layers stacked respectively corresponding to the at least two classification groups, and an insulation layer interposed between the adjacent conductive metal thin film layers.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Below, embodiments of an apparatus for aiding a toilet user in standing up according to the disclosure with the foregoing objects, solutions, and effects will be described in detail with reference to the accompanying drawings.

Figure 1:
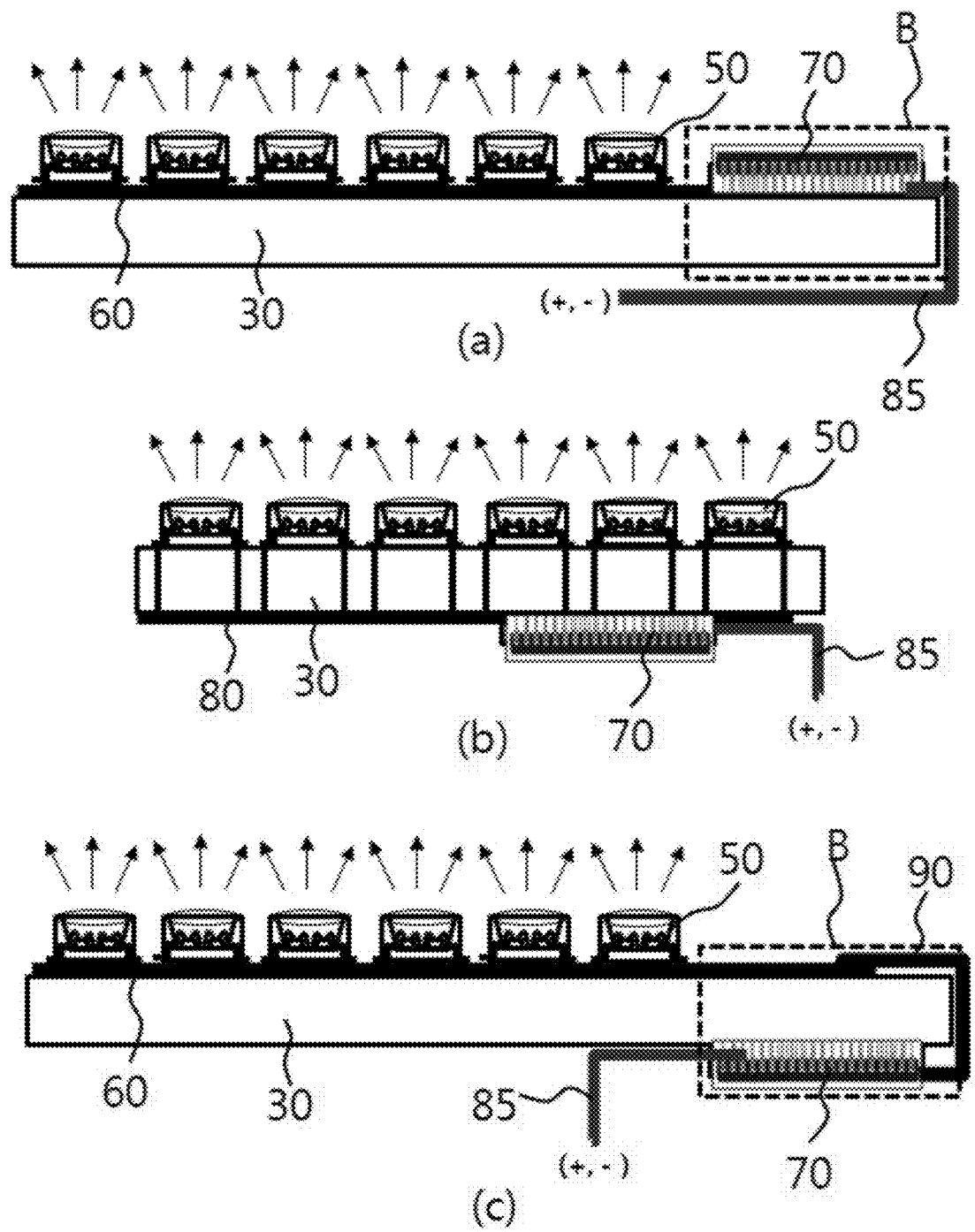
FIG. 1 is a schematic cross-section view of a conventional light emitting diode (LED) display module.
Figure 2:
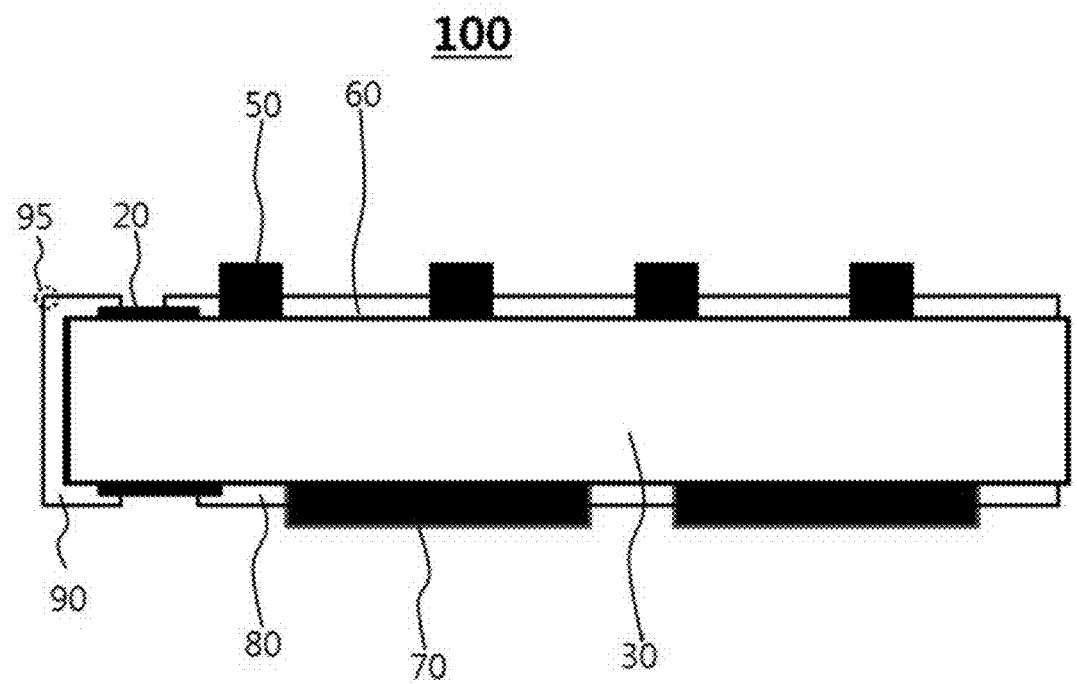
FIG. 2 is a schematic cross-section view of an LED display module according to an embodiment of the disclosure.

FIG. 2 is a schematic cross-section view of a light emitting diode (LED) display module according to an embodiment of the disclosure.

As shown in FIG. 2, an LED display module 100 according to an embodiment of the disclosure includes a substrate 30, a plurality of display devices 50 mounted to a top side of the substrate 30, an upper circuit pattern 60 formed on the top side of the substrate 30, a controller device 70 mounted to the top or bottom side of the substrate 30, a lower circuit pattern 80 formed on the bottom side of the substrate 30, and lateral side wiring 90 electrically connecting the upper circuit pattern 60 and the lower circuit pattern 80.

The substrate 30 may include any substrate required to form a circuit pattern and required for connection of the circuit pattern through a lateral side portion. That is, the substrate 30 according to the disclosure may include any of glass, a printed circuit board (PCB), a flexible printed circuit board (FPCB), plastic, a film, and the like substrate on which the circuit pattern is formed and wiring may be on the lateral-side portion for electric connection with the circuit pattern. In particular, the substrate 30 according to the disclosure may be mounted with various devices on the top and bottom thereof, and respectively formed with circuit patterns on the top and bottom thereof.

The plurality of display devices 50 to be mounted on the top side of the substrate 30 may include LEDs, in particular, micro LEDs. Therefore, the plurality of display devices 50, i.e. a plurality of micro LEDs is mounted on the top side of the substrate 30, thereby forming a display device matrix.

On the top side of the substrate 30, the wiring, i.e. the upper circuit pattern 60 for the display devices 50 is formed. That is, the upper circuit pattern 60 is formed on the top side of the substrate 30, and transfers power and/or a signal to the plurality of display devices 50. The upper circuit pattern 60 transfers the power and/or signal from the lower side of the substrate 30 to the plurality of display devices 50 through the lateral side wiring 90.

To control signals for the plurality of display devices 50, the controller device 70 is mounted to the top or bottom side of the substrate 30. However, the LED display module 100 according to the disclosure employs a structure having no bezels, and therefore the controller device 70 may be mounted to the bottom side of the substrate 30. Besides the controller device 70, other necessary devices may be separately mounted to the bottom side of the substrate 30. Like this, the controller device 70 and various related devices for controlling the plurality of display devices 50 and transceiving an electric signal may be mounted to the bottom side of the substrate 30.

The lower circuit pattern 80 is formed at the bottom side of the substrate. That is, the wiring, i.e. the lower circuit pattern 80 for the controller devices 70, etc. is formed on the bottom side of the substrate 30. Therefore, the lateral side wiring 90 for electrically connecting the upper circuit pattern 60 and the lower circuit pattern 80 is formed on the substrate lateral-side portion 10 as shown in FIG. 2.

Figure 3:
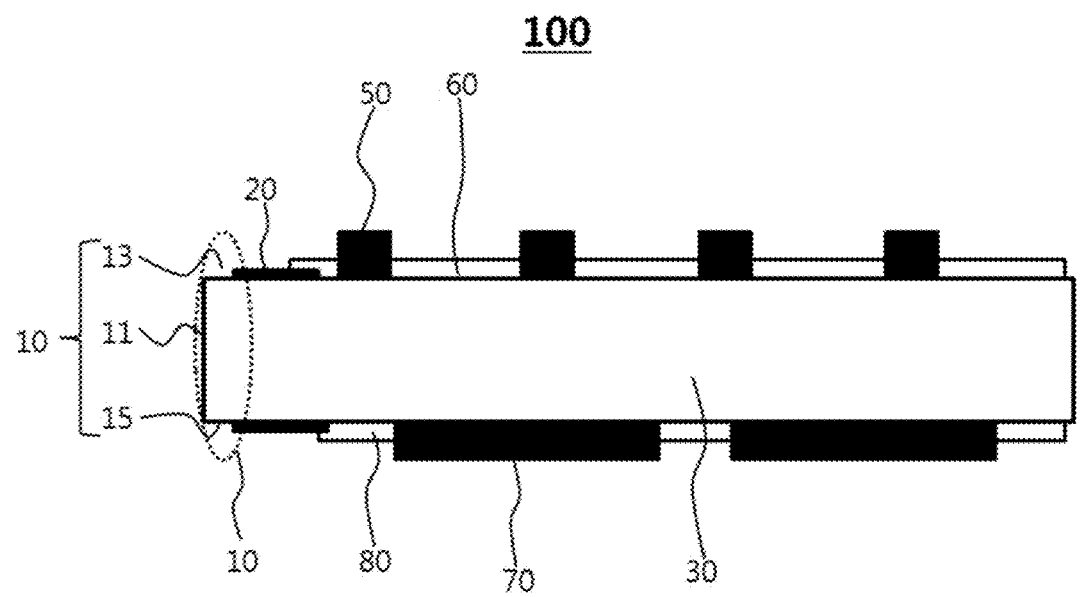
FIG. 3 is a schematic cross-section view of a substrate lateral-side portion in an LED display module according to an embodiment of the disclosure.

The lateral side wiring 90 is formed on the substrate lateral-side portion 10. Specifically, as shown in FIG. 3, the substrate lateral-side portion 10 according to the disclosure includes the lateral side 11 of the substrate 30, and the top (i.e. the side-adjacent top 13) and the bottom (i.e. the side-adjacent bottom 15) of the substrate which are adjacent to the lateral side 11 of the substrate 30, and the wiring on the substrate lateral-side portion 10, i.e. lateral side wiring 90 is formed to electrically connect a upper circuit pattern 60 formed on the top of the substrate 30 and a lower circuit pattern 80 formed on the bottom of the substrate 30.

The lateral side wiring 90 formed on the substrate lateral-side portion 10 has a cross-section of "⊏" as shown in FIG. 2 so as to electrically connect the upper circuit pattern 60 and the lower circuit pattern 80. Because the lateral side wiring 90 has the "⊏"-shape for the electric connection between the upper circuit pattern 60 and the lower circuit pattern 80, the substrate lateral-side portion 10 formed with the lateral side wiring 90 corresponds to a portion that includes not only the lateral side 11 of the substrate 30 but also the side-adjacent top 13 and the side-adjacent bottom 15 as shown in FIG. 3.

On the contrary to the conventional method of using the FPCB, the lateral side wiring 90 formed on the substrate lateral-side portion 10 according to the disclosure is formed by a plasma deposition method or the like. That is, the lateral side wiring 90 according to the disclosure may include a conductive metal thin film layer formed by the deposition.

Like this, the conductive metal thin film layer formed by the deposition is employed as the lateral side wiring 90 according to the disclosure. Accordingly, when the LED display modules 100 according to the disclosure are connected and assembled into an LED display, a bezel line is not seen on a display screen. In particular, when the conductive metal thin film layer having a thickness of 2~10 μm is formed as the lateral side wiring 90, the bezel line is not seen on the display screen.

Meanwhile, the lateral side wiring 90 is formed by a deposition process in a vacuum chamber. Specifically, a module substrate 30, in which only the lateral side wiring 90 is not formed (i.e. a substrate 30 formed with the upper circuit pattern 60, the lower circuit pattern 80, etc. except the lateral side wiring 90), is received and subjected to a process of depositing the lateral side wiring 90 to connect the upper circuit pattern 60 and the lower circuit pattern 80 in the vacuum chamber. To this end, the connection terminal layers 20 are respectively provided in the top side and the bottom side of the substrate 30.

The connection terminal layer 20 refers to a circuit pattern for electrically connecting the upper circuit pattern 60 and the lower circuit pattern 80 through the lateral side wiring 90. The connection terminal layer 20 formed on the upper circuit pattern 60 electrically connects the upper circuit pattern 60 with the lateral side wiring 90 deposited on an upper side 13 of the substrate 30 adjacent to the lateral side, and the connection terminal layer 20 formed on the lower circuit pattern 80 electrically connects the lower circuit pattern 60 with the lateral side wiring 90 deposited on a lower side 15 of the substrate 30 adjacent to the lateral side.

The lateral side wiring 90 refers to the conductive metal thin film layer formed by the deposition as described above, and needs to be protected from the outside because the lateral side wiring 90 is used as a circuit pattern for electrically connecting the upper circuit pattern 60 and the lower circuit pattern 80. To this end, the lateral side wiring 90 may be coated with a protection layer 40 of epoxy or the like. Because the lateral side wiring 90 is formed by the deposition, the protection layer 40 according to the disclosure may also be formed by the deposition so as to improve a process efficiency and perform successive processes as shown in FIG. 4.

Figure 4:
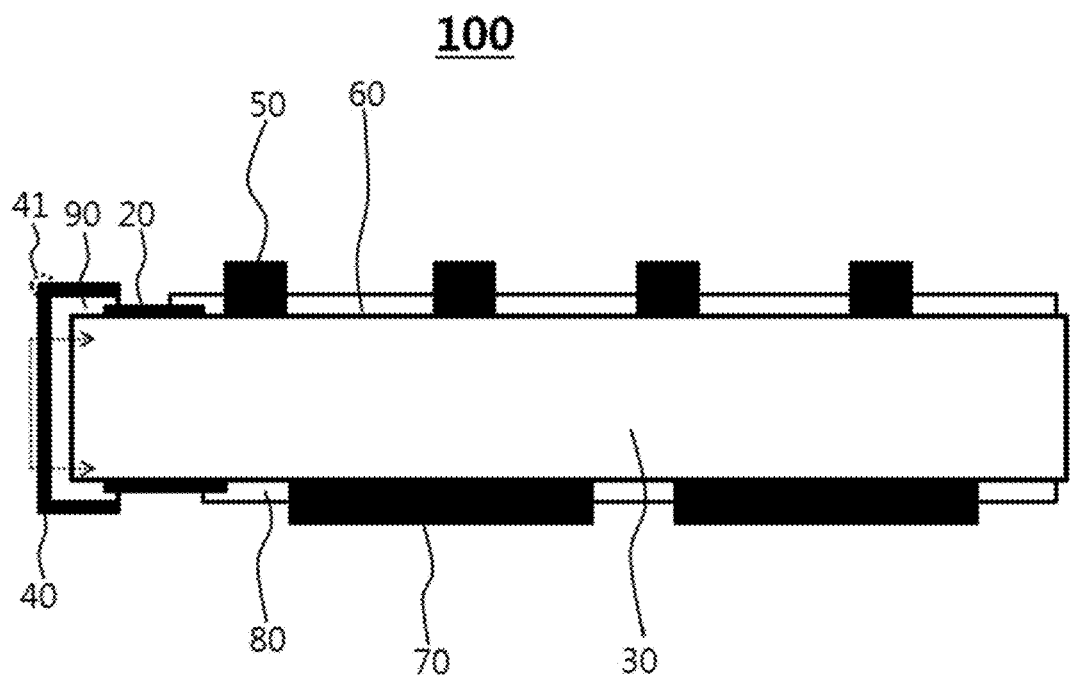
FIG. 4 is a schematic cross-section view of the LED display module according to another embodiment of the disclosure.

In other words, the LED display module 100 according to the disclosure may further include the protection layer 40 deposited on the lateral side wiring 90 as shown in FIG. 4. The protection layer 40 may be formed in succession to the lateral side wiring 90 in one vacuum chamber.

Figure 6:
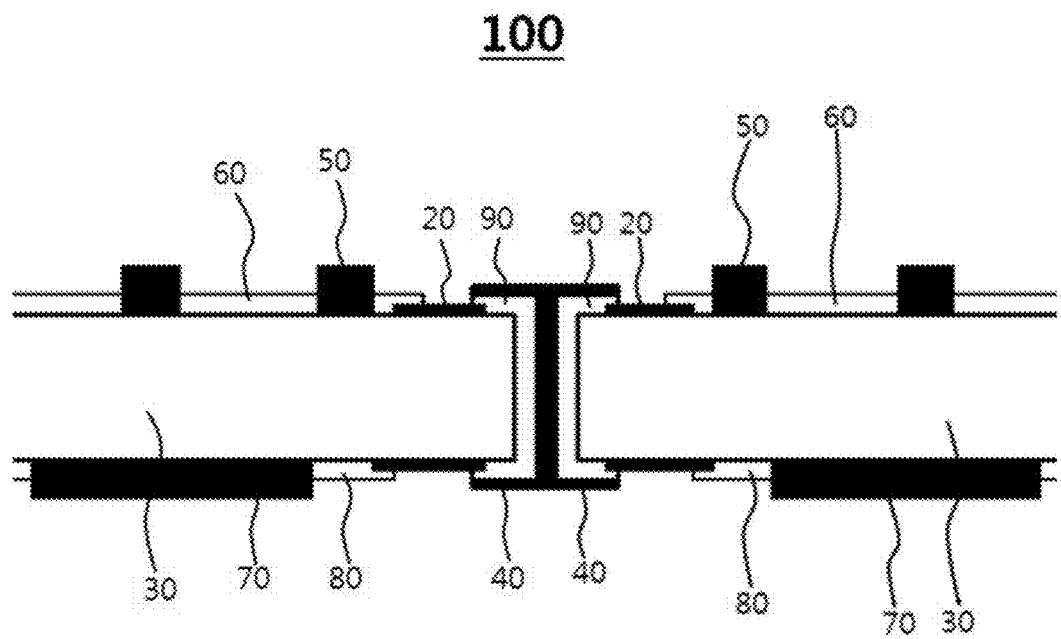
FIG. 6 is a cross-section view of showing a connected state of LED display modules according to an embodiment of the disclosure.

Meanwhile, the protection layer 40 based on the deposition according to the disclosure may be deposited on the lateral side wiring 90 in order to protect and electrically insulate the lateral side wiring 90 when the LED display modules 100 according to the disclosure are assembled into a single large format LED display by surface contact as shown in FIG. 6.

Figure 7:
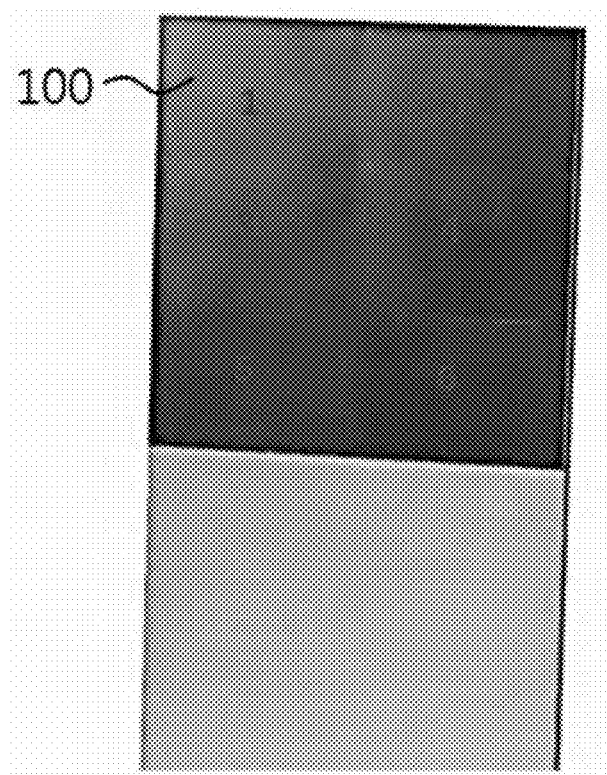
FIG. 7 illustrates a display completed by connecting a plurality of LED display modules according to an embodiment of the disclosure.

Like this, the LED display modules 100 according to the disclosure may be arrayed as connected in at least one of a horizontal direction and a vertical direction as shown in FIG. 7 to make the single large format LED display, and the protection layers 40 of the connected LED display modules 100 adjacent to each other are in surface contact with each other as shown in FIG. 6, and each edge portion 41 of the protection layer 40 is rounded.

FIG. 7 illustrates six LED display modules 100 are horizontally and vertically adjacent to one another to make a single large format LED display. In this case, the LED display modules 100 are connected to the adjacent LED display modules 100 based on the surface contact between their protection layers 40. To prevent or minimize damage or breakage of the LED display modules 100 while the LED display modules 100 are connected by the surface contact, the edge portion 41 (see FIG. 4) of the protection layer 40 to be subjected to the surface contact may be rounded.

Meanwhile, the protection layer 40 is deposited on the lateral side wiring 90 and formed in succession to the lateral side wiring 90, and therefore the lateral side wiring 90 may also have a rounded, i.e. curved edge portion 95 (see FIG. 2).

The LED display module 100 according to the disclosure may include a micro LED display module and configure a high-resolution and large-format micro LED display. In result, the plurality of display devices 50, i.e. the number of micro LEDs increases, and thus the upper circuit pattern 60 and the like wiring are also largely increased. Therefore, a problem may arise in that the conductive metal thin film layer of a single layer is insufficient for the lateral side wiring 90 to make the largely increased number of micro LEDs and the plurality of upper circuit patterns 60 and the like wiring connected to the micro LEDs be connected to the lower circuit pattern 80.

To solve such a problem, the LED display module 100 includes the plurality of display devices 50 divided into a plurality of classification groups to be electrically connected corresponding to a plurality of conductive metal thin film layers, and the lateral side wiring 90 includes the plurality of conductive metal thin film layers (see '91' in FIG. 5) to be electrically connected corresponding to the plurality of classification groups. Among the plurality of conductive metal thin film layers 91, the conductive metal thin film layers 91 adjacent to each other may be electrically separated from each other by an insulation layer 93.

Figure 5:
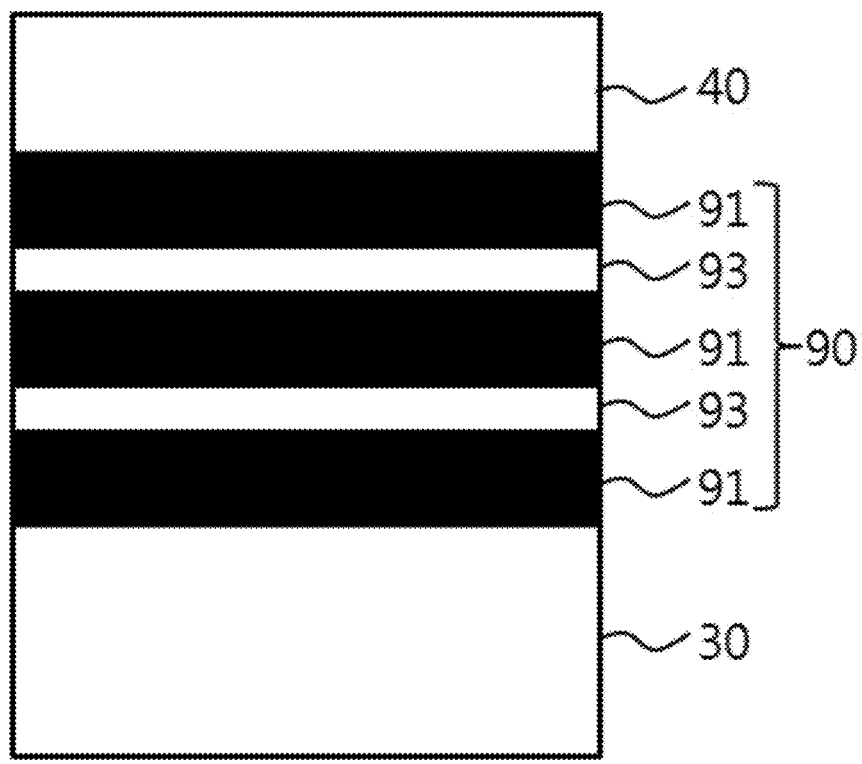
FIG. 5 is a schematic cross-section view of lateral side wiring in an LED display module according to an embodiment of the disclosure.

Like this, the plurality of display devices 50 according to the disclosure may be divided into at least two classification groups, and, as shown in FIG. 5, the lateral side wiring 90 may include at least two conductive metal thin film layers 91 stacked respectively corresponding to the at least two classification groups, and the insulation layer 93 formed between the adjacent conductive metal thin film layers 91.

The lateral side wiring 90 according to the disclosure may be formed by the deposition as described above. Hereinafter, the deposition forming process of the lateral side wiring 90 applied to the present invention will be schematically described First, the substrate lateral-side portion 10 to be formed with the wiring is masked. That is, a mask for deposition is attached to the substrate, thereby applying a masking process to the substrate lateral-side portion 10 on which the wiring will be formed. The masking process of the substrate lateral-side portion includes operation of attaching the mask for deposition to the substrate 30 so that the wiring can be deposited on the substrate lateral-side portion 10 in a vacuum chamber. The mask for deposition is formed to have a "["-shape, and thus attached to the top and bottom of the substrate as well as the substrate lateral-side portion 10 of the substrate 30.

The mask for deposition may be formed by a film, metal, and ink printing. In particular, the mask for deposition may be given in the form of a polyimide (PI) film. When the PI film is used as the mask for deposition, the mask for deposition is closely attached to the substrate 30 including the substrate lateral-side portion 10 with various kinds of adhesive in between.

With adhesive interposed in between the PI film mask and the substrate 30, the PI film mask is first subjected to a provisional bonding process so as to be temporarily attached to the substrate 30 under a predetermined processing condition, and then subjected to a definite bonding process so as to be bonded to the substrate 30 under a predetermined processing condition.

When the masking operation of bonding the mask for deposition to the substrate 30 including the substrate lateral-side portion 10, on which the wiring will be formed, is completed, deposition process is performed with regard to the masked substrate 30. That is, the masked substrate 30 is introduced into a vacuum chamber, and then the wiring is formed on the substrate lateral-side portion 10 through the sputtering.

Meanwhile, the deposition process in the vacuum chamber is used to form the lateral side wiring 90, and therefore the conductive metal thin film layer corresponding to the lateral side wiring 90 formed on the substrate lateral-side portion 10 is deposited inside the vacuum chamber. To form high-quality wiring, an adhesive metal layer corresponding to a seed layer may be formed on the substrate lateral-side portion 10 before forming the conductive metal thin film layer. In other words, the adhesive metal layer corresponding to the seed layer, the conductive metal thin film layer corresponding to the lateral side wiring 90, and the protection layer are sequentially deposited on the substrate lateral-side portion 10 according to the disclosure.

The adhesive metal layer may contain a conductive material, e.g. a metallic material. The metallic material may include one of alloy of nickel (Ni) and chrome (Cr), titanium (Ti), molybdenum (Mo), stainless (SUS), or alloy of them as a single layer or a multiple layer.

For example, the adhesive metal layer may contain alloy of nickel and chrome. A weight ratio of nickel to chrome in the adhesive metal layer including nickel and chrome may be selected within a range of 8:2 to 9.5:0.5. Chrome may improve enhance the adhesive force between the substrate (in particular, a plastic substrate) and the conductive metal thin film layer. The adhesive metal layer made of the alloy of nickel and chrome may improve the adhesive force between the substrate and the conductive metal thin film layer more than about 1.5 times stronger than that of the adhesive metal layer that contains only nickel.

When the adhesive metal layer contains the alloy of nickel and chrome, the deposition process is improved in thin-film forming efficiency as compared with that of the adhesive metal layer that contains only nickel. The deposition by sputtering or the like performed using only nickel having magnetism may lower the thin-film thickness uniformity or the like quality of the adhesive metal layer. However, the sputtering performed using the alloy of nickel and chrome according to an embodiment of the disclosure improves the quality of the formed thin film, and enhances the adhesive force between the substrate and the conductive metal thin film layer as described above.

After the adhesive metal layer is formed on the substrate lateral-side portion 10 by the deposition, the conductive metal thin film layer corresponding to the lateral side wiring 90 is formed on the adhesive metal layer. The conductive metal thin film layer may be formed including various kinds of metal or alloy. For example, the conductive metal thin film layer may contain copper, or may be provided as a tin (Sn)-based lead-free metal layer which contains tin (Sn) of not lower than about 85 wt %. Besides tin (Sn), the conductive metal thin film layer may contain at least one among silver (Ag), copper (Cu), bismuth (Bi), Zinc (Zn), and indium (In). In a case where the conductive metal thin film layer contains silver (Ag) and copper (Cu), the conductive metal thin film layer may contain silver (Ag) more than copper (Cu) to have a lower melting point.

After the conductive metal thin film layer is deposited on the adhesive metal layer by the sputtering as described above, the protection layer 40 is deposited on the conductive metal thin film layer inside the same chamber 110 by the sputtering.

The protection layer 40 may contain a metallic material. For example, the protective metallic material may include one of alloy of nickel (Ni) and chrome (Cr), titanium (Ti), molybdenum (Mo), stainless (SUS), or alloy of them, like the adhesive metal layer. Preferably, the protection layer is made of the same material as the adhesive metal layer inside the same chamber 110. Like this, the adhesive metal layer and the protection layer are made of the same material inside one chamber, thereby simplifying the whole processes and thus minimizing time, efforts and costs of fabricating the substrate. The protection layer protects the conductive metal thin film layer from corrosion and contamination during fabrication, distribution and the like processes.

Meanwhile, as described above, the wiring formed on the substrate lateral-side portion 10 are formed by sequentially stacking the adhesive metal layer, the conductive metal thin film layer corresponding to the lateral side wiring 90 and the protection layer inside the same chamber by the sputtering, and therefore each metal layer can be subjected to the ion beam process. In other words, the vacuum chamber 110 for the disclosure supports the ion beam process as described above, and therefore the ion beam process is performed before forming each metal layer, thereby enhancing attachment, adhesion, and close-contact between the substrate and the adhesive metal layer and between the metal layers.

Specifically, inside one vacuum chamber, the substrate lateral-side portion 10 is first subjected to the ion beam process, and then the adhesive metal layer is deposited on the substrate lateral-side portion 10 by the sputtering. Next, the adhesive metal layer is subjected to the ion beam process, and then the conductive metal thin film layer corresponding to the lateral side wiring 90 is deposited on the adhesive metal layer by the sputtering. Next, the conductive metal thin film layer is subjected to the ion beam process, and then the protection layer is deposited on the conductive metal thin film layer by the sputtering. Like this, the ion beam processes are performed in one vacuum chamber before forming the metal layers, thereby enhancing close contact between the substrate and the metal layer and between the metal layers through a simplified process and a simplified apparatus structure and thus improving efficiency of fabricating the substrate.

With an LED display module according to the disclosure for the technical problems and solutions, a conductive metal thin film layer formed by deposition is used to configure lateral side wiring for connecting an upper circuit pattern and a lower circuit pattern of a substrate, thereby removing a bezel, and guaranteeing display quality because a division line or a bezel line is not seen even when a plurality of modules undergoes tiling to get a desired display size.

Further, according to the disclosure, a plurality of display devices is divided into at least two classification groups, and the lateral side wiring includes at least two conductive metal thin film layers stacked respectively corresponding to the at least two classification groups, thereby having an effect on coping with large increase in narrow and long wiring caused as micro LEDs are used to make a large-format high-resolution display.

Although a few exemplary embodiments of the disclosure have been shown and described, these are for illustrative purpose only and it will be appreciated by those skilled in the art that changes may be made in these embodiments without departing from the principles and spirit of the invention, the scope of which is defined in the appended claims and their equivalents.

What is claimed is:

1. A light emitting diode (LED) display module comprising:
   a substrate;
   a plurality of display devices mounted to a top side of the substrate;
   an upper circuit pattern formed on the top side of the substrate;
   a controller device mounted to a bottom side of the substrate;
   a lower circuit pattern formed on the bottom side of the substrate;
   lateral side wiring electrically connecting the upper circuit pattern and the lower circuit pattern; and
   a connection terminal layer being disposed on a top side and a bottom side of the substrate, respectively, and connecting the upper circuit pattern and the lower circuit pattern through the lateral side wiring,
   each of the plurality of display devices comprising a micro LED,
   the lateral side wiring comprising a conductive metal thin film layer having a thickness of 2 to 10 μm formed by deposition, and
   the LED display module further comprising a protection layer deposited on an entire portion of the lateral side wiring.

2. A light emitting diode (LED) display comprising a plurality of LED display modules according to claim 1, wherein
   the plurality of LED display modules are provided in an array connected in at least one of horizontal direction and a vertical direction to configure the LED display,
   the protection layers of the connected LED display modules adjacent to each other are in surface contact with each other, and
   the protection layer comprises an edge portion subject to the surface contact between the protection layers, the edge portion defining an edge of the lateral side wiring.

3. The LED display according to claim 2, wherein
   the plurality of display devices are divided into at least two classification groups,
   the lateral side wiring comprises at least two conductive metal thin film layers stacked respectively corresponding to the at least two classification groups, and an insulation layer interposed between the adjacent conductive metal thin film layers.

* * * * *